United States Patent
Tsukahara

(10) Patent No.: US 8,416,032 B2
(45) Date of Patent: Apr. 9, 2013

(54) SEMICONDUCTOR SWITCH, TRANSCEIVER, TRANSMITTER, AND RECEIVER

(75) Inventor: Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 330 days.

(21) Appl. No.: 12/917,520

(22) Filed: Nov. 2, 2010

(65) Prior Publication Data

US 2011/0234333 A1    Sep. 29, 2011

(30) Foreign Application Priority Data

Mar. 23, 2010  (JP) ................. 2010-065989

(51) Int. Cl.
*H01P 1/10*     (2006.01)
*H01P 1/15*     (2006.01)

(52) U.S. Cl. ........................ 333/101; 333/103

(58) Field of Classification Search ........... 333/101, 333/103, 104
See application file for complete search history.

(56) References Cited

U.S. PATENT DOCUMENTS

| | | |
|---|---|---|
| 4,920,285 A | 4/1990 | Clark et al. |
| 5,748,054 A | 5/1998 | Tonegawa et al. |
| 6,094,088 A | 7/2000 | Yano |
| 6,512,409 B2 | 1/2003 | Yoneda |
| 7,106,146 B2 * | 9/2006 | Tsukahara et al. ........... 333/104 |
| 7,280,006 B2 * | 10/2007 | Hase ........................... 333/103 |
| 7,411,471 B2 * | 8/2008 | Tsukahara ................... 333/104 |
| 7,532,087 B2 * | 5/2009 | Mizutani .................... 333/104 |

FOREIGN PATENT DOCUMENTS

| | | |
|---|---|---|
| JP | 7-75328 B2 | 8/1995 |
| JP | 7-235802 A | 9/1995 |
| JP | 8-204622 A | 8/1996 |
| JP | 10-242826 A | 9/1998 |
| JP | 2000-183776 A | 6/2000 |
| JP | 2000-196495 A | 7/2000 |
| JP | 2000-196496 A | 7/2000 |
| JP | 2002-171186 A | 6/2002 |

OTHER PUBLICATIONS

Lin, Kun-You, et al.; "Millimeter-Wave MMIC Passive HEMT Switches Using Traveling-Wave Concept", *IEEE Transactions on Microwave Theory and Techniques*, vol. 52, No. 8, (Aug. 2004) pp. 1798-1808.

State Intellectual Property Office of the People'S Republic of China, Office Action in Chinese Patent Application No. 2011100690094 (Oct. 12, 2012).

* cited by examiner

*Primary Examiner* — Dean O Takaoka
(74) *Attorney, Agent, or Firm* — Leydig, Voit & Mayer, Ltd.

(57) ABSTRACT

A semiconductor switch includes a main line, branch lines branching from the main line at the same branch point, switching devices shunt-connected between one of the branch lines and ground and operated so that the one of the branch lines is connected to and disconnected from ground, a main terminal connected to an end of the main line, and branch terminals connected to an end of one of the branch lines. The impedance of one of the branch lines, as seen from the branch point, is conjugately matched to the combined impedance of the main line and the rest of the branch lines, as seen from the branch point, the one of the branch lines transmitting an RF signal, and the rest of the branch lines blocking the RF signal.

17 Claims, 17 Drawing Sheets

SEMICONDUCTOR SWITCH, TRANSCEIVER, TRANSMITTER, AND RECEIVER

BACKGROUND OF THE INVENTION

1. Field of the Invention

The present invention relates to a semiconductor switch, a transceiver, a transmitter, and a receiver which switch an RF signal between lines.

2. Background Art

There has been a demand to reduce the transmission loss in semiconductor switches which generally operate in millimeter wave bands. In some semiconductor switches, switching devices are shunt-connected to signal transmission lines (that is, they are connected at one end to the signal transmission lines and at the other end to ground) to reduce the transmission loss. FIG. 30 shows a conventional semiconductor switch that includes such switching devices. Specifically, the semiconductor switch, 100, shown in FIG. 30 is a general millimeter wave SPDT (single pole double throw) switch. In the semiconductor switch 100 shown in FIG. 30, each of two branch lines includes two switching devices and two transmission lines in order to enhance the isolation of the branch line when it is in the OFF state. Further, the switching devices are field effect transistors (FET).

In the semiconductor switch 100 shown in FIG. 30, a main terminal Tm for an RF signal is connected to a branch point P by a main transmission line Lmb1 which forms a main line Lmb. The branch point P is connected to a branch terminal T1 through a transmission line Lb11 and a transmission line Lb12 which form a branch line Lb1. The branch point P is also connected to a branch terminal T2 through a transmission line Lb21 and a transmission line Lb22 which form a branch line Lb2. The main transmission line Lmb1 and the transmission lines Lb11, Lb12, Lb21, and Lb22 have the same characteristic impedance. The transmission lines Lb11, Lb12, Lb21, and Lb22 have a length equal to one-quarter of the wavelength, $\lambda$, of the RF signal transmitted on these transmission lines.

A switching device SW11 is shunt-connected to the junction between the transmission lines Lb11 and Lb12. That is, one end of the switching device SW11 is connected between the transmission lines Lb11 and Lb12, and the other end is grounded. A switching device SW12 is shunt-connected to the junction between the branch terminal T1 and the transmission line Lb12. Further, a switching device SW21 is shunt-connected to the junction between the transmission lines Lb21 and Lb22.

A switching device SW22 is shunt-connected to the junction between the transmission line Lb22 and the branch terminal T2. A control voltage is applied to the control terminals V1 of the switching devices SW11 and SW12, and another control voltage is applied to the control terminals V2 of the switching devices SW21 and SW22. Since, as described above, the transmission lines Lb11, Lb12, Lb21, and Lb22 have a length equal to one quarter wavelength $\lambda/4$ of the RF signal, the impedances of these transmission lines can be controlled by controlling the control voltages applied to the control terminals V1 and V2. That is, the RF signal from the main terminal Tm can be selectively transmitted through one of the two branch lines. This construction allows for reduction of the transmission loss in the semiconductor switch 100.

FIG. 31 shows a semiconductor switch which differs from that shown in FIG. 30 in that the FETs are replaced by diodes. In this case, a control voltage is applied to a diode D11 and a diode D12 through the branch terminal T1, and another control voltage is applied to a diode D21 and a diode D22 through the branch terminal T2 to switch the RF signal between the branch lines. Although in the semiconductor switch 100 shown in FIG. 30 the branch line Lb1 between the branch point P and the branch terminal T1 includes two transmission lines (namely the transmission lines Lb11 and Lb12), in other constructions the branch line Lb1 may include only one switching device and one transmission line. For example, the transmission line Lb12, the switching device SW12, the transmission line Lb22, and the switching device SW22 may be omitted from the construction shown in FIG. 30 to reduce the size of the semiconductor switch 100 at some sacrifice of the isolation of the branch lines.

FIG. 32 is an equivalent circuit diagram of the semiconductor switch shown in FIG. 30 when the switching devices SW11 and SW12 are turned on (by applying a voltage of 0 V to the control terminals V1) and the switching devices SW21 and SW22 are turned off (by applying a voltage less than the pinch-off voltage to the control terminals V2). In this case, each of the switching devices SW11 and SW12 is equivalent to a series connection of an on-resistance (Ron) and a parasitic inductive component (Lp). Therefore, the transmission lines Lb11 and Lb12, which have a length equal to one quarter wavelength $\lambda/4$ of the RF signal, act approximately as shorted stubs and hence have high impedance. As a result, the RF signal does not propagate through the transmission lines Lb11 and Lb12.

On the other hand, each of the switching devices SW21 and SW22 is equivalent to a series connection of an off-capacitance (Coff) and a parasitic inductive component (Lp), since a voltage less than the pinch-off voltage is applied to the control terminals V2, as described above. Therefore, the impedances of the transmission lines Lb21 and Lb22 are substantially equal to their characteristic impedances. As a result, the RF signal input from the main terminal Tm propagates through the branch line Lb2 to the branch terminal T2.

FIG. 33 is a Smith chart showing impedances in the equivalent circuit shown in FIG. 32. In this chart, point A indicates the impedance looking toward the main terminal Tm from the branch point P (i.e., looking in the direction of arrow A in FIG. 32), which impedance is hereinafter referred to as the "impedance A"; point B indicates the impedance looking toward the branch terminal T1 from the branch point P (i.e., looking in the direction of arrow B in FIG. 32), which impedance is hereinafter referred to as the "impedance B"; and point C indicates the impedance looking toward the branch terminal T2 from the branch point P (i.e., looking in the direction of arrow C in FIG. 32), which impedance is hereinafter referred to as the "impedance C." The impedance A of the main line side is equal to the characteristic impedance Zo of the main line and therefore is located at the center of the Smith chart. The impedance C is the combined impedance of the transmission lines Lb21 and Lb22 (which have a length equal to one quarter wavelength $\lambda/4$ of the RF signal) and the off-capacitances of the switching devices SW21 and SW22 and is located substantially at the center of the Smith chart. On the other hand, the impedance B is high and is located near the rightmost edge of the horizontal axis of the Smith chart, since the transmission lines Lb11 and Lb12 act substantially as $\lambda/4$ shorted stubs and have high impedance as a result of the impedances of the switching devices SW11 and SW12 being very low (equal to the on-resistance).

Referring to the equivalent circuit diagram shown in FIG. 32, the RF signal applied to the main terminal Tm propagates through the main transmission line Lmb1 to the branch point P. However, the RF signal does not go through the transmission lines Lb11 and Lb12, since the impedance B (looking from the branch point P) is high. On the other hand, the impedance C of the branch line Lb2 side that includes the transmission lines Lb21 and Lb22 is approximately equal to the characteristic impedance Zo (i.e., approximately equal to the impedance A). Therefore, the RF signal propagates from the branch point P through the transmission lines Lb21 and Lb22, since the impedance C is conjugately matched to the impedance A. That is, in this case, the branch line Lb1 side (including the transmission lines Lb11 and Lb12) functions as the OFF side, or the RF signal-blocking side, of the switch. On the other hand, the branch line Lb2 side (including the transmission lines Lb21 and Lb22) functions as the ON side, or the RF signal-transmitting side, of the switch. This is accomplished since the voltages described above are applied to the control terminals of the switching devices SW11, SW12, SW21, and SW22.

It should be noted that if the RF signal is applied to the branch terminal of the branch line side which is functioning as the OFF side of the switch, instead of being applied to the main terminal Tm, the RF signal does not reach the main terminal Tm and the other branch terminal since the branch line side is in a high impedance state. On the other hand, if the RF signal is applied to the branch terminal of the branch line side which is functioning as the ON side, the RF signal reaches the main terminal Tm but does not reach the other branch terminal.

It should be noted that semiconductor switches are disclosed in Japanese Laid-Open Patent Publication Nos. 2000-196495, H10-242826, H07-235802, 2002-171186, and 2000-183776. The above Japanese Laid-Open Patent Publication No. 2000-196495 discloses a semiconductor switch having a reduced number of transmission parts, resulting in reduced transmission loss.

The construction of the above conventional semiconductor switch 100 requires that the transmission lines Lb11, Lb12, Lb21, and Lb22 have a length equal to one-quarter of the wavelength of the RF signal. This requirement results in increase of the dimensions of the semiconductor switch, thus preventing reduction of the size of the switch. The construction shown in FIG. 31 in which diodes are used as switching devices also has the same problem. This means that it is not possible to reduce the dimensions of transceivers, transmitters, and receivers using the above semiconductor switch.

SUMMARY OF THE INVENTION

The present invention has been made to solve the above problems. It is, therefore, an object of the present invention to provide a small sized semiconductor switch, transceiver, transmitter, and receiver.

According to one aspect of the present invention, a semiconductor switch includes a main line, a plurality of branch lines branching from the main line at the same branch point, switching devices each shunt-connected between one of the plurality of branch lines and ground and operated by a control voltage so that the one of the plurality of branch lines is electrically connected to and disconnected from ground, a main terminal connected to an end of the main line, and branch terminals each connected to an end of one of the plurality of branch lines. Wherein the impedance of one of the plurality of branch lines as seen from the branch point is conjugately matched to the combined impedance of the main line and the rest of the plurality of branch lines as seen from the branch point, the one of the plurality of branch lines functioning to transmit an RF signal, the rest of the plurality of branch lines functioning to block the RF signal.

Other and further objects, features and advantages of the invention will appear more fully from the following description.

DETAILED DESCRIPTION OF THE PREFERRED EMBODIMENTS

First Embodiment

A first embodiment of the present invention will be described with reference to FIGS. 1 to 9. It should be noted that certain of the same or corresponding components are designated by the same reference symbols and described only once.

Figure 1:
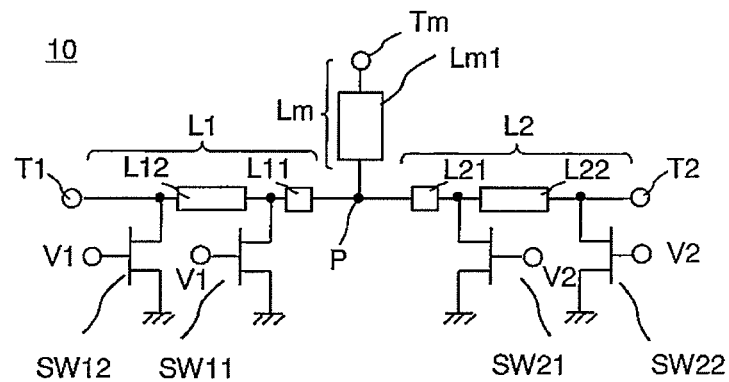
FIG. 1 is a circuit diagram showing a semiconductor switch of the first embodiment.

FIG. 1 is a circuit diagram showing a semiconductor switch 10 of the first embodiment. A main terminal Tm, a branch terminal T1, and a branch terminal T2 are connected to each other through a branch point P. The millimeter wave RF signal input to the main terminal Tm is transmitted to the branch terminal T1 or T2.

The construction of the semiconductor switch 10 will be described in detail. The main terminal Tm is connected to the branch point P by a main line Lm. The main line Lm includes a low impedance line Lm1. The main terminal Tm is connected to an end of the main line Lm.

The branch terminal T1 is connected to the branch point P by a branch line L1, that is, the branch terminal T1 is connected to an end of the branch line L1. This branch line L1 includes a transmission line L11 and a transmission line L12. One end of the transmission line L11 is connected to the branch point P. The other end of the transmission line L11 is connected to one end of the transmission line L12. The other end of the transmission line L12 is connected to the branch terminal T1. The transmission line L11 has a length equal to or less than one-eighth of the wavelength of the RF signal. The transmission line L12 has a length equal to one-eighth to one-quarter of the wavelength of the RF signal. A switching device SW11 and a switching device SW12 are connected to the branch line L1. One end of the switching device SW11 is connected between the other end of the transmission line L11 and the one end of the transmission line L12. The other end of the switching device SW11 is grounded. One end of the switching device SW12 is connected between the other end of the transmission line L12 and the branch terminal T1. The other end of the switching device SW12 is grounded. The control terminals V1 of the switching devices SW11 and SW12 are connected to an external control terminal (not shown) of the semiconductor switch 10 or to another control circuit (not shown), etc.

The branch terminal T2 is connected to the branch point P by a branch line L2, that is, the branch terminal T2 is connected to an end of the branch line L2. This branch line L2 includes a transmission line L21 and a transmission line L22. One end of the transmission line L21 is connected to the branch point P. The other end of the transmission line L21 is connected to one end of the transmission line L22. The other end of the transmission line L22 is connected to the branch terminal T2. The transmission line L21 has a length equal to or less than one-eighth of the wavelength of the RF signal. The transmission line L22 has a length equal to one-eighth to one-quarter of the wavelength of the RF signal. A switching device SW21 and a switching device SW22 are connected to the branch line L2. One end of the switching device SW21 is connected between the other end of the transmission line L21 and the one end of the transmission line L22. The other end of the switching device SW21 is grounded. One end of the switching device SW22 is connected between the other end of the transmission line L22 and the branch terminal T2. The other end of the switching device SW22 is grounded. The control terminals V2 of the switching devices SW21 and SW22 are connected to an external control terminal (not shown) of the semiconductor switch 10 or to another control circuit (not shown), etc.

Thus, each of the plurality of switching devices (namely, switching devices SW11, SW12, SW21, and SW22) is shunt-connected between one of the plurality of branch lines (namely, the branch lines L1 and L2) and ground. Control voltages are applied to these switching devices to turn them on and off so as to electrically connect the branch lines to and disconnect the branch lines from ground. The switching devices SW11, SW12, SW21, and SW22 are FETs (field effect transistors). They may be, but are not limited to, GaAs-FETs or GaN-FETs.

Thus, the semiconductor switch 10 includes the branch lines L1 and L2 branching from the main line Lm at the branch point P. The combined impedance of the main line Lm and the one of the branch lines which is functioning to block the RF signal, as seen from the branch point P, is conjugately matched to the impedance of the other branch line, which is functioning to transmit the RF signal, as seen from the branch point P. The meaning of this will be explained later. The transmission lines L11 and L12, which form the branch line L1, and the transmission lines L21 and L22, which form the branch line L2, all have the same characteristic impedance (Zo). Zo is, e.g., 50 Ω, and the characteristic impedance of the main line Lm is lower than Zo. This completes the description of the configuration of the semiconductor switch 10 of the first embodiment.

Figure 2:
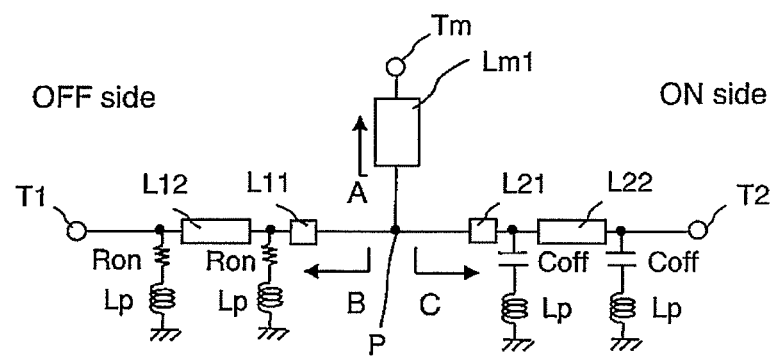
FIG. 2 is an equivalent circuit diagram of the semiconductor switch shown in FIG. 1.

The operation of the semiconductor switch 10 of the first embodiment will now be described. FIG. 2 is an equivalent circuit diagram of the semiconductor switch 10 shown in FIG. 1 when the switching devices SW11 and SW12 are turned on (by applying a voltage of 0 V to the control terminals V1) and the switching devices SW21 and SW22 are turned off (by applying a voltage less than the pinch-off voltage to the control terminals V2). In this case, each of the switching devices SW11 and SW12 is equivalent to a series connection of an on-resistance (Ron) and a parasitic inductive component (Lp), as shown in FIG. 2. Each of the switching devices SW21 and SW22, on the other hand, is equivalent to a series connection of an off-capacitance (Coff) and a parasitic inductive component (Lp). In FIG. 2, the phrase "ON side" means the branch line side of the semiconductor switch 10 which is functioning to transmit the RF signal. The phrase "OFF side" means the branch line side of the semiconductor switch 10 which is functioning to block the RF signal.

Figure 3:
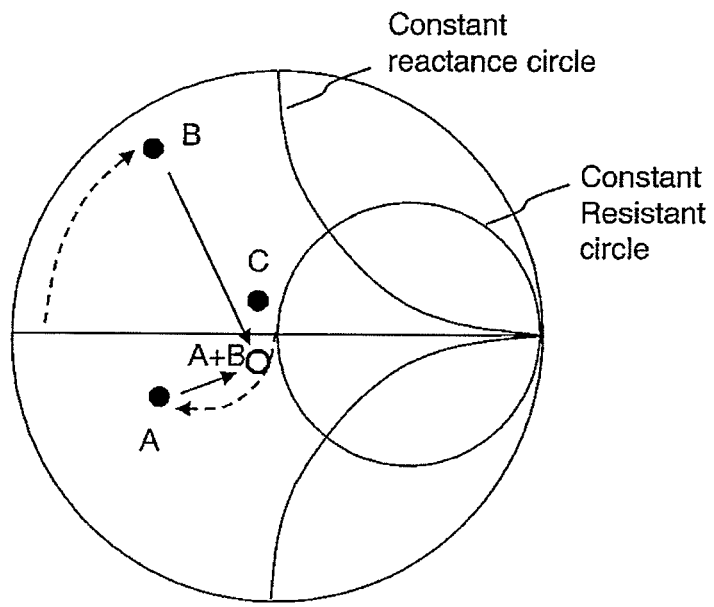
FIG. 3 is a Smith chart showing impedances in the equivalent circuit shown in FIG. 2.

FIG. 3 is a Smith chart showing impedances in the equivalent circuit shown in FIG. 2. In FIG. 3, point A indicates the impedance looking in the direction of arrow A of FIG. 2 in the semiconductor switch 10 of the first embodiment (which impedance is hereinafter referred to as the "impedance A"). That is, the impedance A is, e.g., the impedance at 60 GHz looking toward the main terminal Tm from the branch point P. Point B in FIG. 3 indicates the impedance looking in the direction of arrow B of FIG. 2 (which impedance is hereinafter referred to as the "impedance B"). That is, the impedance B is the impedance looking toward the branch terminal T1 from the branch point P. Further, point C in FIG. 3 indicates the impedance looking the direction of arrow C of FIG. 2 (which impedance is hereinafter referred to as the "impedance C"). That is, the impedance C is the impedance looking toward the branch terminal T2 from the branch point P.

The impedance A is equal to the characteristic impedance of the main line Lm. When the main line Lm is made up of a low impedance line Lm1 having a certain length (as shown in FIG. 1), the real part of the impedance A is smaller than the characteristic impedance Zo and the imaginary part of the impedance A is negative (i.e., the impedance A is capacitive). This means that the impedance A is located in the lower left quadrant of the Smith chart. The transmission lines L11, L12, L21, and L22 have a characteristic impedance of Zo. It should be noted that if lines (not shown) and devices (not shown) such as amplifiers are connected to the main line Lm, the impedance A includes the impedances of these components.

The impedance B, which is the impedance of the OFF side of the semiconductor switch 10, is a combination of the impedances of the transmission lines L11 and L12 (which are dependent on their length) and the on-resistances (Ron) and the parasitic inductive components of the switching devices SW11 and SW12. In the Smith chart, point B representing the impedance B is spaced an angle clockwise from the point corresponding to the on-resistance Ron with respect to the center of the Smith chart. The angle is determined by the lengths of the transmission lines L11 and L12, and the point corresponding to the on-resistance Ron is located near the leftmost edge of the horizontal axis of the Smith chart, which edge corresponds to 0 Ω.

The impedance C, which is the impedance of the ON side of the semiconductor switch 10, is a combination of the impedances of the transmission lines L21 and L22 and the off-capacitances and the parasitic inductive components of the switching devices SW21 and SW22. Since the length of the transmission line L22 is equal to one-eighth to one-quarter of the wavelength of the RF signal, the impedance C represented by point C in the Smith chart has a positive imaginary part (i.e., the impedance C is inductive).

Figure 4:
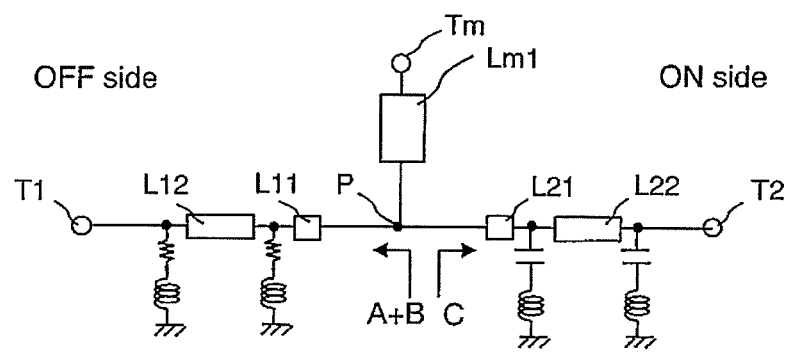
FIG. 4 shows a symbol A+B which denotes the combined impedance of the main line side and the OFF side of the semiconductor switch as seen from the point P, which impedance is a combination of the impedance A and the impedance B.

In FIG. 4, the symbol A+B denotes the combined impedance of the main line side and the OFF side of the semiconductor switch 10 as seen from the point P, which impedance is a combination of the impedance A and the impedance B. Point A+B in the Smith chart of FIG. 3 indicates this impedance A+B. In accordance with the first embodiment, the combined impedance A+B is conjugately matched to the impedance C. That is, in FIG. 3, the points representing these impedances are symmetrically located about the real axis, or horizontal axis, of the Smith chart. This means that the real part of the impedance A+B is substantially equal to Zo, and the imaginary part is negative. In order to achieve this it is preferable that point A is located in the lower left quadrant of the Smith chart, which is accomplished when the low impedance line Lm1 is capacitive.

The greater the length and width of the low impedance line Lm1, the more capacitive the line. Further, the transmission line L11 preferably has a length equal to or less than one-eighth wavelength λ/8 of the RF signal so that point B is located in the upper left quadrant of the Smith chart. When the length of the transmission line L11 is equal to λ/8, point B is located substantially at the topmost point of the chart. The position of point B in the Smith chart is dependent substantially solely on the length of the transmission line L11 and is not substantially dependent on the length of the transmission line L12. The reason for this is because the impedance of the switching device SW11 connected to the other end of the transmission line L11 is substantially zero (since the switch is in its ON state). Thus, the lengths and widths of the low impedance line Lm1 and the transmission lines L11 and L12 are chosen so as to satisfy the above conjugate matching conditions.

When the impedance A+B is thus conjugately matched to the impedance C, the RF signal applied to the main terminal T reaches the branch point P through the main line Lm but does not propagate through the branch line L1 (including the transmission lines L11 and L12) since the impedance B greatly differs from the characteristic impedance Zo. On the other hand, the RF signal goes through the branch line L2 (including the transmission lines L21 and L22) to the branch terminal T2, since the impedance C is conjugately matched to the impedance A+B. Thus, the RF signal applied to the main terminal Tm is transmitted only to the branch terminal T2 of the ON side of the semiconductor switch 10.

The following description will be directed to the transmission of an RF signal when it is applied to the branch terminal T1 and when it is applied to the branch terminal T2. The RF signal applied to the branch terminal T1 does not propagate through the branch line L1, since the impedance B greatly differs from the characteristic impedance Zo. On the other hand, the RF signal applied to the branch terminal T2 propagates through the branch line L2 to the branch point P, since the impedance C is close to the characteristic impedance Zo. Most of the RF signal reaching the branch point P goes through the main line Lm to the main terminal Tm, since the impedance A+B is matched to the impedance C and since the impedance B greatly differs from the characteristic impedance Zo. Thus, when an RF signal is applied to each branch terminal T1, T2, only the RF signal applied to the branch terminal T2 is transmitted to the main terminal Tm, since the branch terminal T2 is on the ON side of the semiconductor switch 10. Thus, the semiconductor switch 10 allows switching between lines for bidirectional transmission.

In the above example, the switching devices SW11 and SW12 are turned on (by applying a voltage of 0 V to the control terminals V1) and the switching devices SW21 and SW22 are turned off (by applying a voltage less than the pinch-off voltage to the control terminals V2). On the other hand, the switching devices SW11 and SW12 may be turned off (by applying a voltage less than the pinch-off voltage to the control terminals V1) and the switching devices SW21 and SW22 may be turned on (by applying a voltage of 0 V to the control terminals V2). From the principle of operation of the semiconductor switch described above it is apparent that in this case the branch line L1 can be set in the ON state (or transmitting state) and the branch line L2 can be set in the OFF state (or blocking state). In this case, the combined impedance of the impedance A and the impedance C as seen from the branch point P need be conjugately matched to the impedance B. (This combined impedance is denoted by the symbol A+C.) Since the branch circuits are symmetrical with respect to the main line, it is easy to satisfy this conjugate matching condition while satisfying the condition that the combined impedance A+B be conjugately matched to the impedance C in the above case where the branch line L1 is in the OFF state and the branch line L2 is in the ON state. Specifically, this is accomplished when the transmission lines L11 and L21 have the same length and the same characteristic impedance and the transmission lines L12 and L22 have the same length and the same characteristic impedance.

Figure 5:
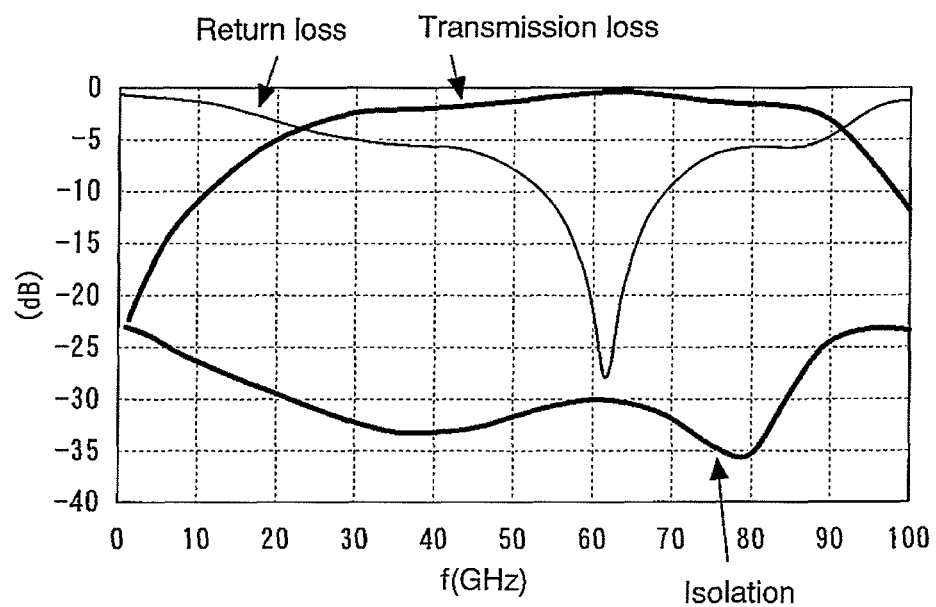
FIG. 5 is a diagram showing the simulation results of the transmission loss, isolation, and return loss (or reflection loss) in the semiconductor switch of the first embodiment.

FIG. 5 is a diagram showing the simulation results of the transmission loss, isolation, and return loss (or reflection loss)

in the semiconductor switch 10 of the first embodiment. The simulation assumed the following: the transmission lines L11, L12, L21, and L22 are microstrip lines having a characteristic impedance Zo of 50 Ω; the transmission lines L11 and L21 have a length of 30 μm and the transmission lines L21 and L22 have a length of 240 μm; the transmission lines L11, L12, L21, and L22 have a width of 70 μm; the wavelength λ of the RF signal transmitted on the transmission lines L11, L12, L21, and L22 is 1600 μm at 60 GHz; and the low impedance line Lm1 has a length of 200 μm and a width of 300 μm and hence has a lower characteristic impedance than the transmission lines L11, L12, L21, and L22. According to the simulation results, the transmission loss from the main terminal Tm to the branch terminal T2 in the semiconductor switch 10 of the first embodiment is −0.4 dB at 60 GHz when the branch terminal T2 side of the semiconductor switch 10 functions as the ON side of the switch.

Figure 30:
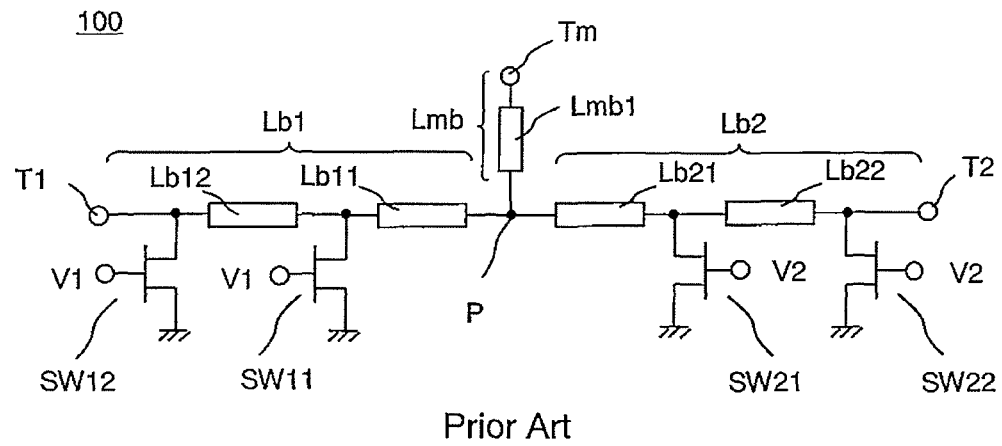
FIG. 30 shows a conventional semiconductor switch that includes such switching devices.
Figure 31:
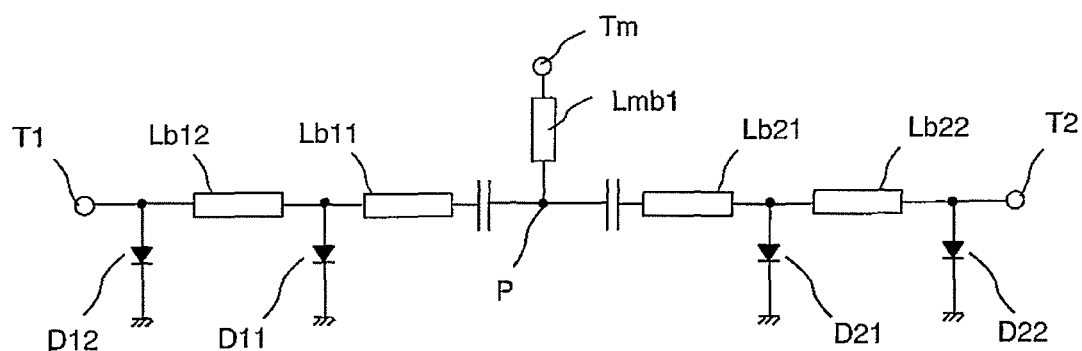
FIG. 31 shows a semiconductor switch which differs from that shown in FIG. 30 in that the FBTs are replaced by diodes.
Figure 32:
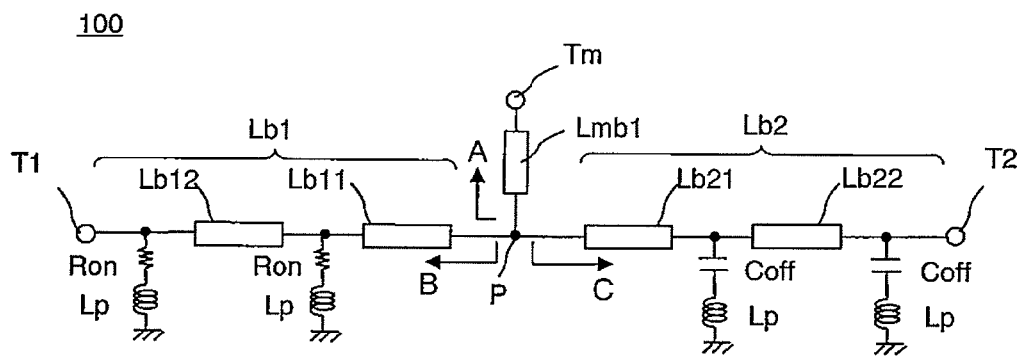
FIG. 32 is an equivalent circuit diagram of the semiconductor switch shown in FIG. 30.
Figure 33:
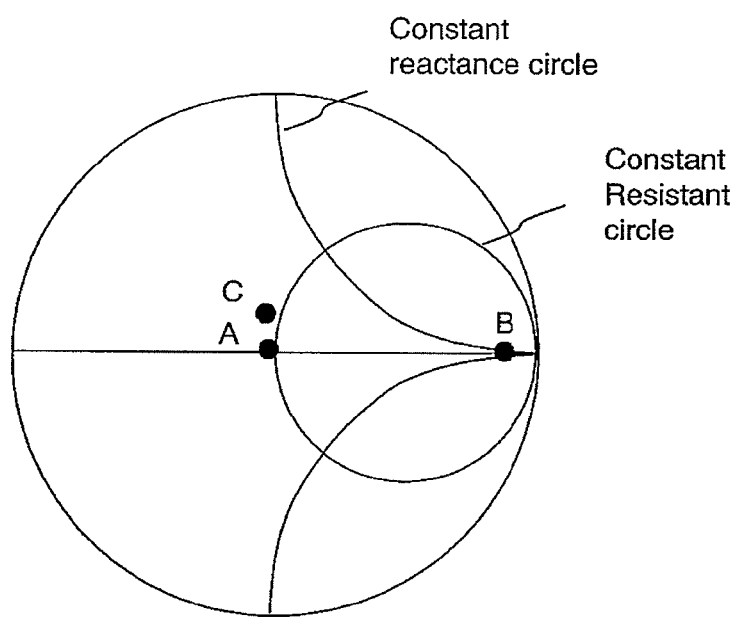
FIG. 33 is a Smith chart showing impedances in the equivalent circuit shown in FIG. 32.
Figure 34:
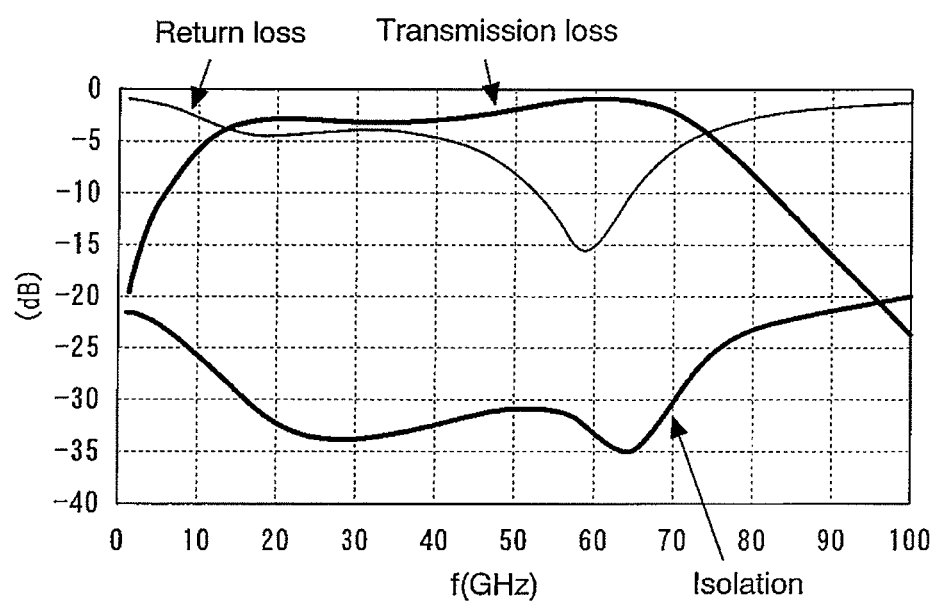
FIG. 34 shows the simulation results of the transmission loss, isolation, and return loss in the semiconductor switch shown in FIG. 30.

FIG. 34 shows the simulation results of the transmission loss, isolation, and return loss in the semiconductor switch 100 shown in FIG. 30. (FIG. 32 is an equivalent circuit diagram of this semiconductor switch.) The simulation assumed the following: the transmission lines Lb11, Lb12, Lb21, and Lb22 all have a length of 400 μm, a width of 70 μm, and a characteristic impedance of 50 Ω; the lengths of the transmission lines Lb11, Lb12, Lb21, and Lb22 (namely 400 μm) are equal to one-quarter of the wavelength of the RF signal transmitted on these transmission lines at 60 GHz, which wavelength is 1600 μm; the main transmission line Lmb1 has a length of 200 μm, a width of 70 μm, and a characteristic impedance of 50 Ω. According to the simulation results, the transmission loss from the main terminal Tm to the branch terminal T2 in the semiconductor switch 100 is −0.4 dB at 60 GHz when the branch terminal T2 side of the semiconductor switch 100 functions as the ON side of the switch. It should be noted that the transmission loss does not substantially change with the length of the main transmission line Lmb1, since the main transmission line Lmb1 has the same characteristic impedance as the transmission lines Lb11, Lb12, Lb21, and Lb22.

As can be seen by comparison between the simulation results of the characteristics of the semiconductor switch 10 of the first embodiment (shown in FIG. 5) and those of the conventional semiconductor switch 100 (shown in FIG. 34), the semiconductor switch 10 of the first embodiment has a transmission loss substantially equal to that of the conventional semiconductor switch 100 at around 60 GHz. Thus, an RF signal can be transmitted through the semiconductor switch 10 with a relatively low loss. This results from the fact that in the semiconductor device 10, the combined impedance of the main line side and the branch line side which is functioning as the OFF side of the switch is conjugately matched to the impedance of the other branch line side which is functioning as the ON side.

In the semiconductor switch 10 of the first embodiment, when the branch terminal T2 side of the switch functions as the ON side, the amount of signal leakage from the main terminal Tm to the branch terminal T1 (i.e., the isolation value) is −30.2 dB at 60 GHz. In the conventional semiconductor switch 100, on the other hand, the isolation value is −33.0 dB under the same conditions. That is, the semiconductor switch 10 of the first embodiment has a poorer isolation value than the conventional semiconductor switch 100 by 3 dB. However, the above isolation value of the semiconductor switch 10 of the first embodiment often meets the isolation requirement of the desired application.

In the semiconductor switch 10 of the first embodiment, the return loss (i.e., the ratio of the reflected signal power to the incident signal power at the main terminal Tm) is −24.2 dB at 60 GHz. In the conventional semiconductor switch 100, on the other hand, the return loss at the main terminal Tm is −14.5 dB at 60 GHz. Thus, the return loss of the semiconductor switch 10 of the first embodiment is lower than that of the conventional semiconductor switch 100, although the loss is dependent on the lengths of the transmission lines L11, L12, L21, and L22.

As shown in FIG. 5, the transmission characteristic (i.e., transmission loss characteristic) of the semiconductor switch 10 of the first embodiment is flat especially over a frequency range greater than 60 GHz. This means that the construction of the semiconductor switch 10 of the first embodiment allows it to be used in wider frequency band applications than those allowed by the prior art. Another disadvantage of the prior art semiconductor switch 100 shown in FIG. 30 is that since it uses λ/4 lines, whose characteristics significantly vary with the wavelength of the signal, it is difficult to ensure that the branch line side functioning as the OFF side has a high impedance at a different frequency than the switching frequency. In the semiconductor switch 10 of the first embodiment, on the other hand, the conjugate matching between the impedances of the main and branch line sides described above can be maintained over a relatively wide frequency range, resulting in flatter transmission characteristics of the switch.

The construction of the semiconductor switch 10 of the first embodiment allows it to be made smaller than the conventional semiconductor switch 100 shown in FIG. 30. The reason for this is because branch lines of the semiconductor switch 10 are shorter than the corresponding branch lines of the semiconductor switch 100. More specifically, the transmission lines Lb11, Lb12, Lb21, Lb22 of the semiconductor switch 100 shown in FIG. 30 are required to have a length equal to one-quarter of the wavelength of the RF signal. On the other hand, the transmission lines L11 and L21 of the semiconductor switch 10 of the first embodiment have a length equal to or less than one-eighth of the wavelength of the RF signal, which allows the switching devices SW11 and SW12 to be disposed closer to the branch point P, thus making it possible to reduce the size of the semiconductor switch 10. Further, the transmission lines L12 and L22 of the semiconductor switch 10 have a length equal to one-eighth to one-quarter of the wavelength of the RF signal to facilitate the arrangement of adjacent switching devices, thus making it possible to further reduce the size of the semiconductor switch 10. Further, the impedance of each branch line side of the switch as seen from the branch point P has a positive imaginary part when the branch line side functions as the ON side.

In the semiconductor switch 10 of the first embodiment, the main line Lm is made up of the low impedance line Lm1. Further, some or all of the transmission lines L11, L12, L21, and L22 can be shorter in length than one-quarter of the wavelength of the RF signal, since the impedances of the main and branch line sides are conjugately matched in the manner described above. Therefore, in this semiconductor switch, the sum of the lengths of the transmission lines of each branch line can be made shorter than in the semiconductor switch 100 shown in FIG. 30, that is, shorter than λ/2. Further, in the semiconductor switch 10 of the first embodiment, the combined length of the transmission lines of each branch line may be equal to or less than λ/4. It should be noted that even if the transmission line Lb12, the switching device SW12, the transmission line Lb22, and the switching device SW22 are omitted from the construction of the semiconductor switch 100 of FIG. 30, the combined length of the transmission lines of each branch line of the switch 100 is λ/4.

Thus, the first embodiment provides a semiconductor switch of reduced size and cost by reducing the lengths of transmission lines of its branch lines while maintaining or enhancing the isolation.

It should be noted that the lengths of the transmission lines L11, L12, L21, and L22 of the first embodiment may be changed from those described above. With suitable choice of the switching frequency and the off-capacitances of the switching devices, these transmission lines may have any lengths as long as the conjugate matching conditions described above are satisfied. For example, the lengths of the transmission lines L12 and L22 may not be equal to one-eighth to one-quarter of the wavelength of the RF signal. The lengths of the transmission lines L12 and L22 may be less than one-eighth but no less than one-twelfth of the wavelength of the RF signal. Further, they may be less than one-twelfth of the wavelength of the RF signal to further reduce the size of the semiconductor switch 10. With suitable arrangement of the switching devices, the size of the semiconductor switch 10 may be reduced as long as the impedance of each branch line side of the semiconductor switch 10 as seen from the branch point P has a positive imaginary part when the branch line side functions as the ON side of the switch so that the conjugate matching conditions described above are satisfied.

Although the first embodiment has been described with reference to semiconductor switches operating at 60 GHz, it is to be understood that the first embodiment may be applied to semiconductor switches operating at any frequency in the millimeter wave band (exceeding 30 GHz), in the quasi millimeter wave band (from 20 GHz to 30 GHz), and in the frequency band from 300 MHz to less than 20 GHz, as long as the low impedance line Lm1 and the transmission lines L11, L12, L21, and L22 are selected so that the conjugate matching conditions described above are satisfied. It should be noted that when the switching device SW12 is spaced from the branch terminal T1, they may be connected together by a transmission line (now shown). Further, although in the above first embodiment the semiconductor switch employs EFTs having a negative pinch-off voltage, in other embodiments the semiconductor switch may employ other types of FETs that allow for switching operation.

Figure 6:
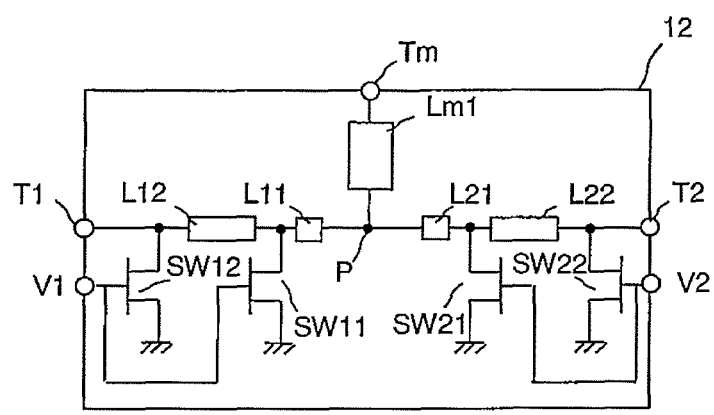
FIG. 6 is a circuit diagram of a first variation of the semiconductor switch of the first embodiment.

FIG. 6 is a circuit diagram of a first variation of the semiconductor switch of the first embodiment. In this semiconductor switch, all of the switching devices SW11, SW12, SW21, and SW22 and the transmission lines L11, L12, L21, and L22 are integrally formed on a single semiconductor substrate (namely a semi-insulating substrate 12 of GaAs). That is, the semiconductor switch is implemented with an MMIC, resulting in reduced cost of mounting it on a module. It should be noted that the semi-insulating substrate 12 may be made of a semiconductor material other than GaAs, e.g., GaN or InP, with the same effect.

Figure 7:
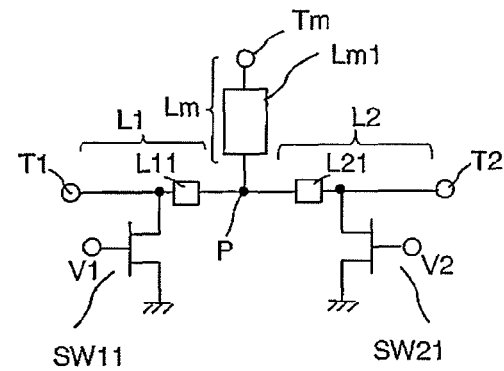
FIG. 7 is a circuit diagram of a second variation of the semiconductor switch of the first embodiment.

FIG. 7 is a circuit diagram of a second variation of the semiconductor switch of the first embodiment. The construction shown in FIG. 7 differs from that shown in FIG. 1 in that the transmission line L12, the switching device SW12, the transmission line L22, and the switching device SW22 are omitted. This construction may also be designed to satisfy the conjugate matching conditions described above in connection with the first embodiment. In this case, the branch line L1 includes only the transmission line L11. One end of the transmission line L11 is connected to the branch point P, and the other end is connected to the branch terminal T1. Likewise, the branch line L2 includes only the transmission line L21. One end of the transmission line L21 is connected to the branch point P, and the other end is connected to the branch terminal T2. The transmission lines L11 and L21 have the same characteristic impedance (Zo). The main line Lm has a lower characteristic impedance than the transmission lines L11 and L21. One end of the switching device SW11 is connected between the other end of the transmission line L11 and the branch terminal T1. The other end of the switching device SW11 is grounded. One end of the switching device SW21 is connected between the other end of the transmission line L21 and the branch terminal T2. The other end of the switching device SW21 is grounded. The lengths of the transmission lines L11 and L21 are preferably equal to or less than one-eighth of the wavelength of the RF signal, as in the first embodiment described above. The construction of this semiconductor switch allows for the reduction of the size of the switch.

Figure 8:
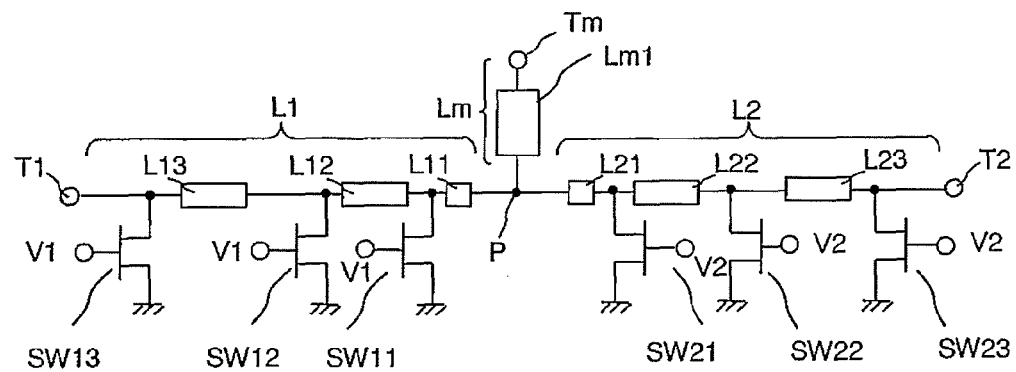
FIG. 8 is a circuit diagram of a third variation of the semiconductor switch of the first embodiment.

FIG. 8 is a circuit diagram of a third variation of the semiconductor switch of the first embodiment. It should be noted that although in the first embodiment the branch line L1 includes two transmission lines L11 and L12, in modifications of the embodiment the branch line L1 may include three or more transmission lines. In such, cases, three or more switching devices may be connected to the branch line L1, as shown in FIG. 8. Further, the other branch line L2 may also include three more transmission lines, and three or more switching devices may be connected to the branch line L2.

In the semiconductor switch shown in FIG. 8, the branch line L1 includes a transmission line L11, a transmission line L12, and a transmission line L13. One end of the transmission line L11 is connected to the branch point P. One end of the transmission line L12 is connected to the other end of the transmission line L11. One end of the transmission line L13 is connected to the other end of the transmission line L12. The other end of the transmission line L13 is connected to the branch terminal T1.

One end of a switching device SW11 is connected between the other end of the transmission line L11 and the one end of the transmission line L12. The other end of the switching device SW11 is grounded. One end of a switching device SW12 is connected between the other end of the transmission line L12 and the one end of the transmission line L13. The other end of the switching device SW12 is grounded. One end of a switching device SW13 is connected between the other end of the transmission line L13 and the branch terminal T1. The other end of the switching device SW13 is grounded. As for the branch line L2 side, the branch line L2 includes three transmission lines L21, L22, and L23 connected to one another in the same manner as the transmission lines L11, L12, and L13 of the branch line L1 described above. Further, switching devices SW21, SW22, and SW23 are connected to the transmission lines L21, L22, and L23 in the same manner as the switching devices SW11, SW12, and SW13 are connected to the transmission lines L11, L12, and L13 of the branch line L1. The transmission lines L11, L12, L13, L21, L22, and L23 all have the same characteristic impedance (Zo). The main line Lm has a lower characteristic impedance than the transmission lines L11, L12, L13, L21, L22, and L23.

The length of each transmission line of each branch line is selected so as to satisfy the conjugate matching conditions described above in connection with the first embodiment. Specifically, the transmission lines L11 and L21 have a length equal to or less than one-eighth of the wavelength of the RF signal, as in the first embodiment. Further, the sum of the lengths of the transmission lines L12 and L13 and the sum of the lengths of the transmission lines L22 and L23 are each preferably equal to one-eighth to one-quarter of the wavelength of the RF signal. Generally, the more switching devices connected to a branch line (and hence the more associated transmission lines in the branch line), the better the isolation of the branch line.

Figure 9:
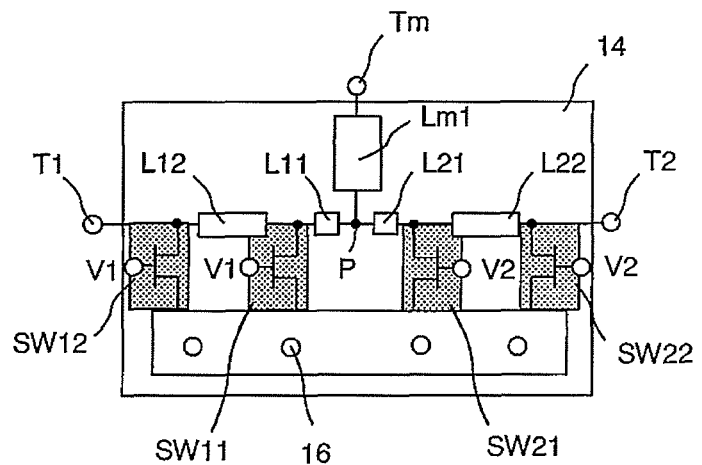
FIG. 9 is a circuit diagram of a fourth variation of the semiconductor switch of the first embodiment.

FIG. 9 is a circuit diagram of a fourth variation of the semiconductor switch of the first embodiment. In this semiconductor switch, the low impedance line Lm1 and the transmission lines L11, L12, L21, and L22 are formed on the surface of a high dielectric constant substrate 14. The switching devices SW11, SW12, SW21, and SW22 are discrete semiconductor devices mounted on the high dielectric constant substrate 14. The switching devices SW11, SW12, SW21, and SW22 are connected at one end to the transmission lines L11, L12, L21, and L22, respectively, and at the other end to ground potential (ground) through grounding through-holes 16. The control terminals of the switching devices SW11, SW12, SW21, and SW22 are connected to a control circuit (not shown).

The construction of this semiconductor switch allows the switch to be manufactured only by mounting the discrete switching devices on the high dielectric constant substrate 14 (e.g., an alumina substrate), resulting in reduced cost. The connection of the switching devices to the transmission lines is accomplished by soldering, wire bonding, or flip chip bonding, etc. This construction allows variations in the characteristics, etc. of the switching devices to be accommodated even after assembly by adjusting the lengths of the transmission lines on the high dielectric constant substrate 14. More specifically, the switching devices may be disconnected from the transmission lines and then reconnected to the transmission lines at appropriate points by soldering or wire bonding.

Second Embodiment

Figure 10:
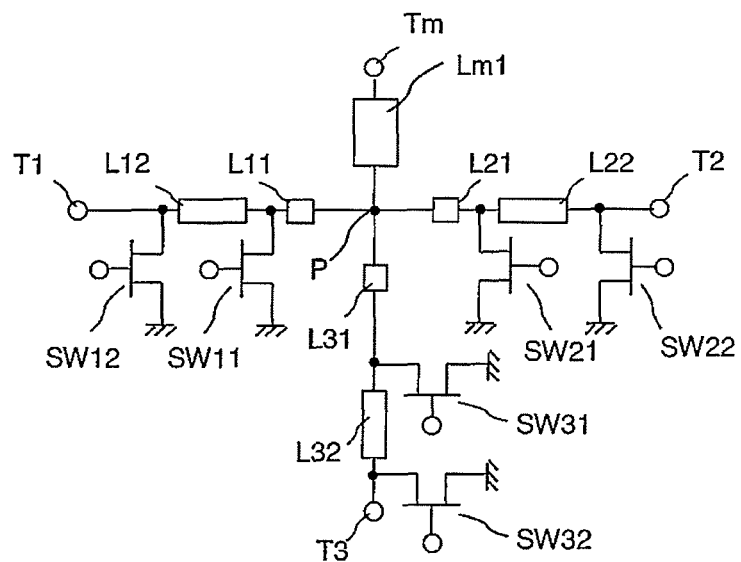
FIG. 10 is a circuit diagram of the semiconductor switch of the second embodiment.

A second embodiment of the present invention will be described with reference to FIGS. 10 to 13. A semiconductor switch of the second embodiment is characterized by having three branch lines. FIG. 10 is a circuit diagram of the semiconductor switch of the second embodiment. This semiconductor switch is a single pole triple throw semiconductor switch. That is, the construction of this semiconductor switch differs from that shown in FIG. 1 in that it additionally includes a branch terminal T3, a transmission line L31, a transmission line L32, a switching device SW31, and a switching device SW32. The transmission lines L31 has the same length as the transmission line L11, and the transmission line L32 has the same length as the transmission line L12. The impedance looking from the branch point P toward the terminal T3 connected to the transmission line L32 (that is, the impedance looking in the direction of arrow D in FIG. 11) is hereinafter referred to as the "impedance D." In this semiconductor switch, the impedances A, B, and C (described above in connection with the first embodiment) and the impedance D are selected so that conjugate matching is achieved, as described later.

Figure 11:
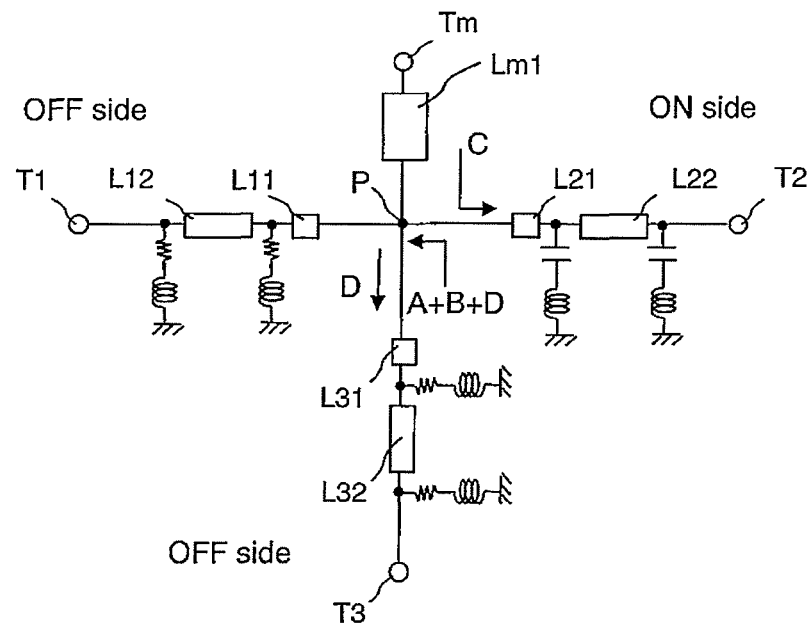
FIG. 11 is an equivalent circuit diagram of the semiconductor switch shown in FIG. 10.
Figure 12:
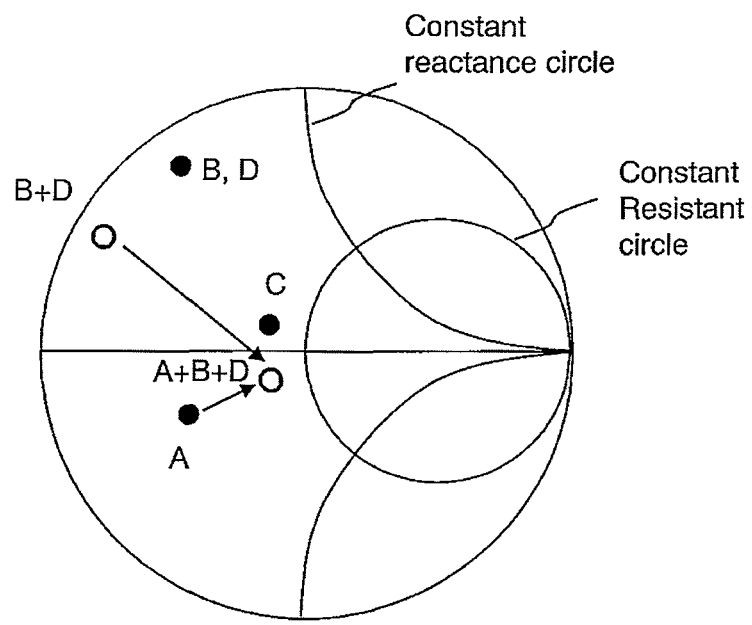
FIG. 12 is a Smith chart showing impedances in the equivalent circuit shown in FIG. 11.
Figure 13:
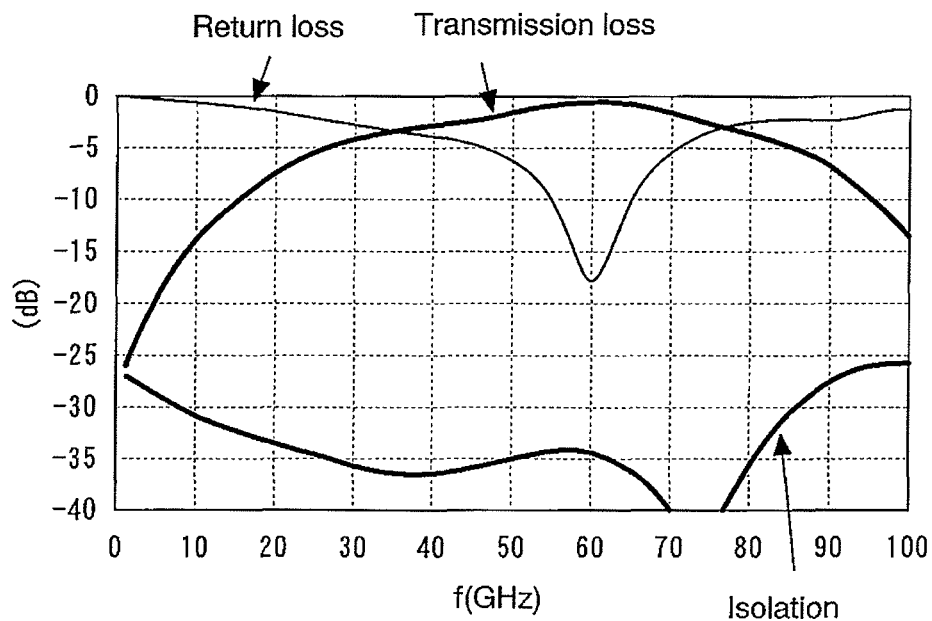
FIG. 13 shows the simulation results of the characteristics of the single pole triple throw semiconductor switch.

FIG. 11 is an equivalent circuit diagram of the semiconductor switch shown in FIG. 10. FIG. 12 is a Smith chart showing impedances in the equivalent circuit shown in FIG. 11. Referring to FIG. 11 and the Smith chart of FIG. 12, the impedance C is conjugately matched to the combined impedance, A+B+D, of the impedances A, B, and D as seen from the branch point P when the branch terminal T2 side of the switch functions as the ON side of the switch. Conjugate matching is also achieved in a similar manner both when the branch terminal T1 side of the switch functions as the ON side and when the branch terminal T3 side functions as the ON side. This arrangement also produces the foregoing effect of the present invention. FIG. 13 shows the simulation results of the characteristics of the single pole triple throw semiconductor switch. As shown in FIG. 13, the transmission loss of this semiconductor switch is substantially equal to that of the semiconductor switch of the first embodiment over the desired frequency range. Thus, the construction of the semiconductor switch allows for the reduction of the size of the switch without degrading its characteristics.

Third Embodiment

Figure 14:
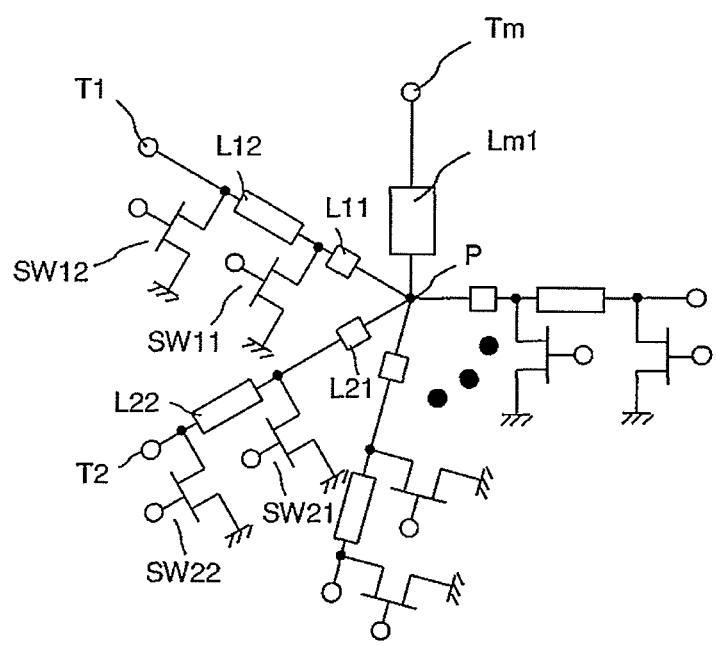
FIG. 14 is a circuit diagram of the semiconductor switch of the third embodiment.

A third embodiment of the present invention will be described with reference to FIG. 14. A semiconductor switch of the third embodiment is characterized by having 4 or more branch lines. FIG. 14 is a circuit diagram of the semiconductor switch of the third embodiment. This semiconductor switch is a single pole n-throw semiconductor switch. The impedances of the main line side and the branch line sides of this single pole n-throw semiconductor switch are also selected so that conjugate matching is achieved in the same manner as described above, and hence a detailed description of this semiconductor switch will be omitted. The construction of the single pole n-throw switch shown in FIG. 14 also produces the forgoing effect of the present invention.

Fourth Embodiment

Figure 15:
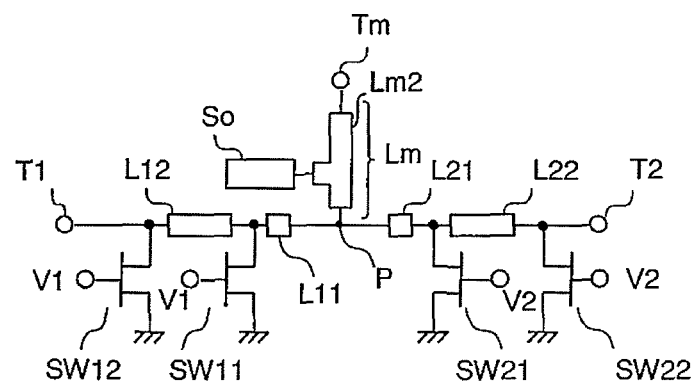
FIG. 15 is a circuit diagram of the semiconductor switch of the fourth embodiment.

A fourth embodiment of the present invention will be described with reference to FIGS. 15 and 16. A semiconductor switch of the fourth embodiment is characterized in that a stub is connected to the main line. FIG. 15 is a circuit diagram of the semiconductor switch of the fourth embodiment. As shown in FIG. 15, an open stub So is connected at one end to a branch of a main transmission line Lm2. (This branch of the main transmission line Lm2 is located intermediate between the main terminal Tm and the branch point P.) The other end of the open stub So is open-circuited. If the length of the open stub So is shorter than one quarter wavelength $\lambda/4$ of the RF signal, the stub is capacitive. Therefore, even if the main transmission line Lm2 has the same characteristic impedance as the transmission lines L11, L12, L21, and L22, the impedance of the main line Lm can be capacitive. The length of the open stub So may be selected so that the conjugate matching conditions described above are satisfied. For example, the open stub So may have a length close to one-eighth wavelength $\lambda/8$ of the RF signal. Therefore, the connection of the open stub So to the main transmission line Lm2 at an intermediate point along the line allows the main transmission line Lm2 to have a shorter length than the low impedance line Lm1 of the first embodiment, etc., making it possible to reduce the size of the semiconductor switch.

Figure 16:
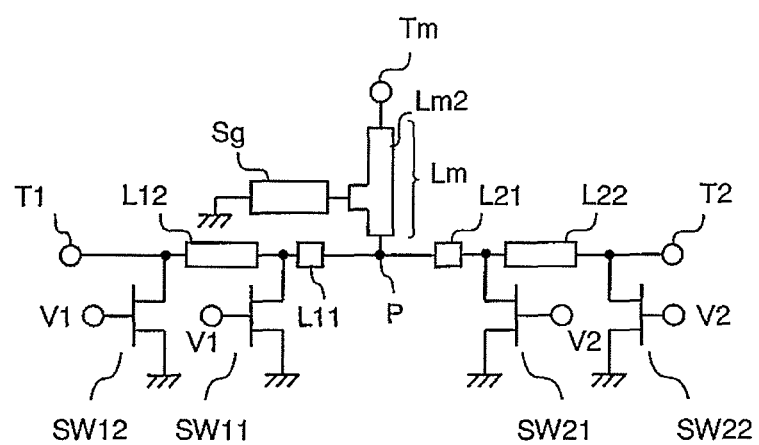
FIG. 16 is a circuit diagram of a variation of the semiconductor switch of the fourth embodiment.

FIG. 16 is a circuit diagram of a variation of the semiconductor switch of the fourth embodiment. This semiconductor switch differs from that of the fourth embodiment in that the open stub So is replaced by a shorted stub Sg. One end of the shorted stub Sg is connected to the main line Lm, and the other end is short-circuited to ground. The use of the shorted stub Sg makes it easy to maintain the DC potential on the RF signal transmission lines at 0 volts. This eliminates the need to externally DC-ground the transmission lines, ensuring stable switching operation of the transistors.

Fifth Embodiment

Figure 17:
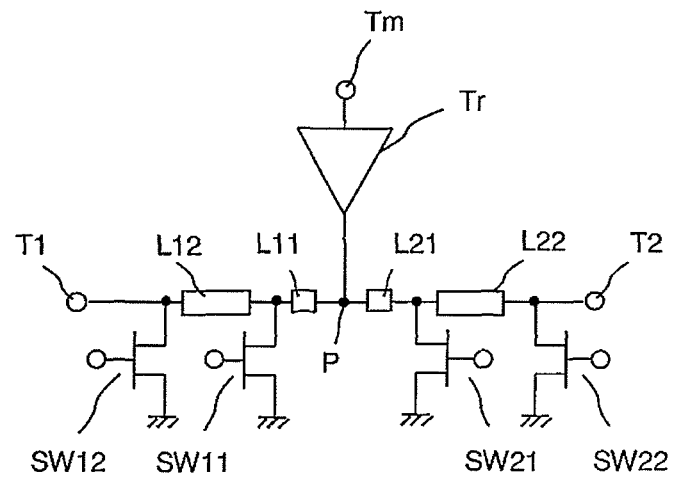
FIG. 17 is a circuit diagram of the semiconductor switch of the fifth embodiment.

A fifth embodiment of the present invention will be described with reference to FIGS. 17 to 20. A semiconductor switch of the fifth embodiment is different from that of the first embodiment and characterized in that an amplifier transistor is substituted for the low impedance line Lm1 of the main line Lm and connected at its input to the main terminal Tm and at its output to the branch point P. FIG. 17 is a circuit diagram of the semiconductor switch of the fifth embodiment.

Figure 18:
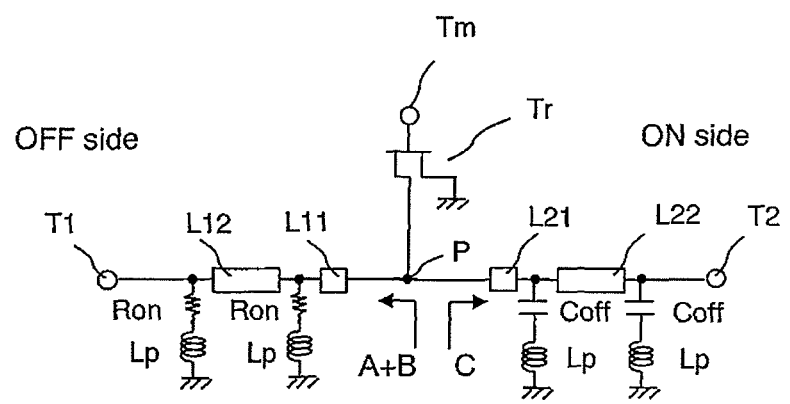
FIG. 18 is an equivalent circuit diagram of the semiconductor switch shown in FIG. 17.

The amplifier transistor, Tr, amplifies the RF signal received from the main terminal Tm and outputs the amplified RF signal to the branch point P. The following description assumes that the switching devices SW11 and SW12 are on and the switching devices SW21 and SW22 are off. Since the output impedance of the amplifier transistor Tr is capacitive, the impedance looking toward the main terminal Tm from the branch point P can be represented by point A in FIG. 3. This means that there is no need for an output matching circuit to be connected to the amplifier transistor Tr, and the output impedance of the amplifier transistor (directly connected to the branch point P) and the impedances of the branch line sides may be selected so as to satisfy the conjugate matching conditions described above in connection with the first embodiment. That is, the RF signal output from the amplifier transistor Tr can be selectively transmitted through one of the branch lines without connecting an output matching circuit to the amplifier transistor, resulting in reduced circuit area and reduced cost. It should be noted that FIG. 18 is an equivalent circuit diagram of the semiconductor switch shown in FIG. 17 when, as described above, the switching devices SW11 and SW12 are on and the switching devices SW21 and SW22 are off.

Figure 19:
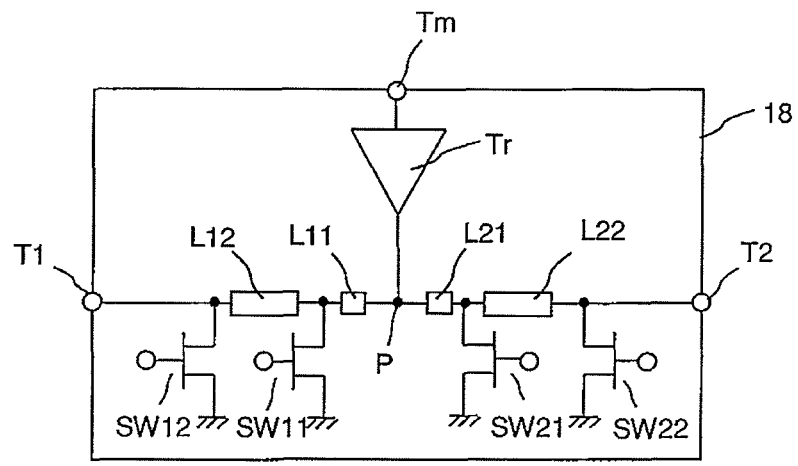
FIG. 19 is a first variation of the semiconductor switch of the fifth embodiment.

FIG. 19 is a first variation of the semiconductor switch of the fifth embodiment. In this semiconductor switch, the amplifier transistor Tr and other components are integrally formed on a semi-insulating substrate 18 (a GaAs substrate, etc.). That is, the semiconductor switch is implemented with an MMIC, resulting in reduced cost of mounting it on a module. It should be noted that a GaN or InP substrate may be used instead of a GaAs substrate, with the same effect.

Figure 20:
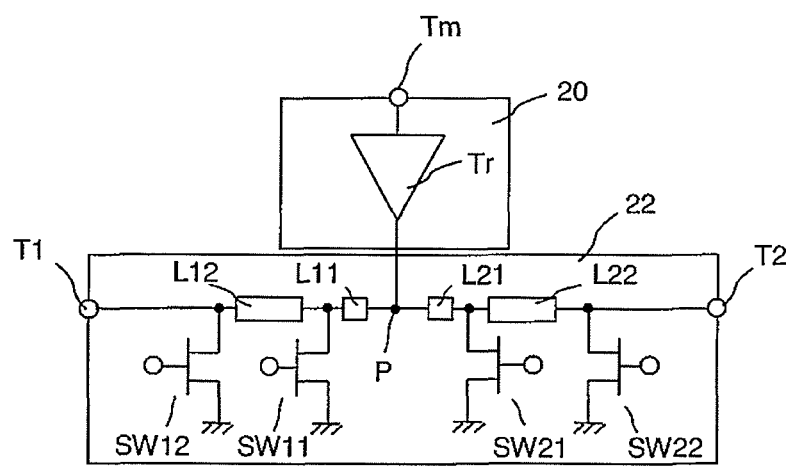
FIG. 20 is a second variation of the semiconductor switch of the fifth embodiment.

FIG. 20 is a second variation of the semiconductor switch of the fifth embodiment. In this semiconductor switch, the amplifier transistor Tr and the subsequent branching stage (which is referred to herein as the "branch unit") are mounted on separate substrates. Specifically, the amplifier transistor Tr is mounted on a substrate 20, and the branch unit is mounted on a substrate 22. This enables the amplifier transistor T1 and the branch unit to be separately-designed. Therefore, the semiconductor switch can be adapted to different applications. That is, the construction of the semiconductor switch can be easily implemented by various types of semiconductor switches. The substrates 20 and 22 may be semi-insulating substrates of GaAs, etc.

Sixth Embodiment

Figure 21:
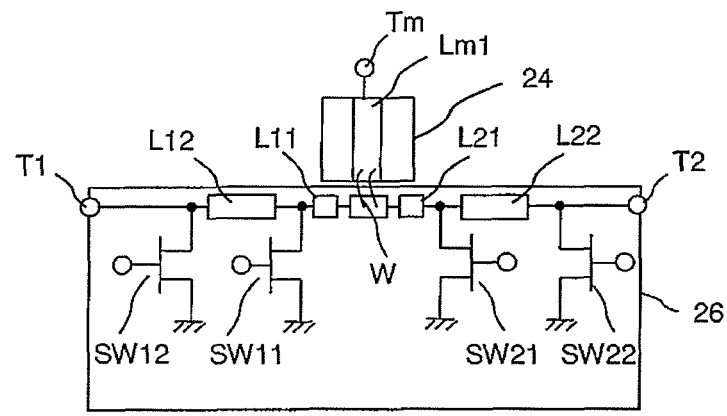
FIG. 21 is a circuit diagram of the semiconductor switch of the sixth embodiment.

A sixth embodiment of the present invention will be described with reference to FIGS. 21 to 24. A semiconductor switch of the sixth embodiment is characterized in that the main line is formed on a high dielectric constant substrate. FIG. 21 is a circuit diagram of the semiconductor switch of the sixth embodiment. As shown in FIG. 21, a low impedance line Lm1 is formed on the high dielectric constant substrate, 24. Transmission lines L11, L12, L21, and L22 and switching devices SW11, SW12, SW21, and SW22 are formed on a semi-insulating substrate 26. The high dielectric constant substrate 24 is connected to the semi-insulating substrate 26 by wires W, etc. The low impedance line Lm1 is generally implemented by a relatively wide line. However, the use of the high dielectric constant substrate 24 allows the low impedance line Lm1 to be implemented by a line having a relatively narrow width, resulting in reduced circuit area.

Figure 22:
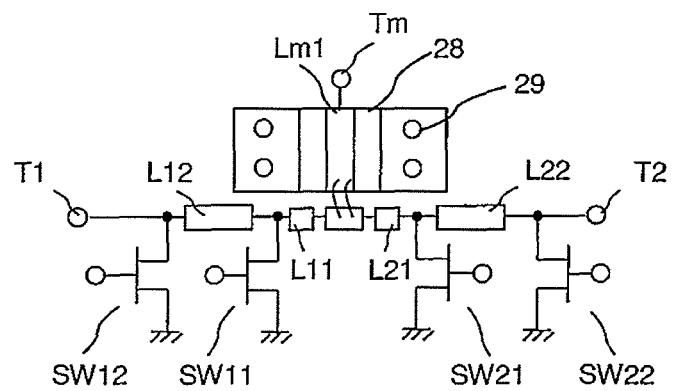
FIG. 22 is a circuit diagram of a first variation of the semiconductor switch of the sixth embodiment.

FIG. 22 is a circuit diagram of a first variation of the semiconductor switch of the sixth embodiment. Whereas in the construction shown in FIG. 21 the low impedance line Lm1 is a microstrip line, in the construction shown in FIG. 22 it is a coplanar line. The construction shown in FIG. 22 allows for the use of a low dielectric constant substrate 28 which is lower in cost than the high dielectric constant substrate 24. Further, in FIG. 22, the low dielectric constant substrate 28 has grounding through-holes 29. This construction makes it possible to reduce the size and cost of the semiconductor switch.

Figure 23:
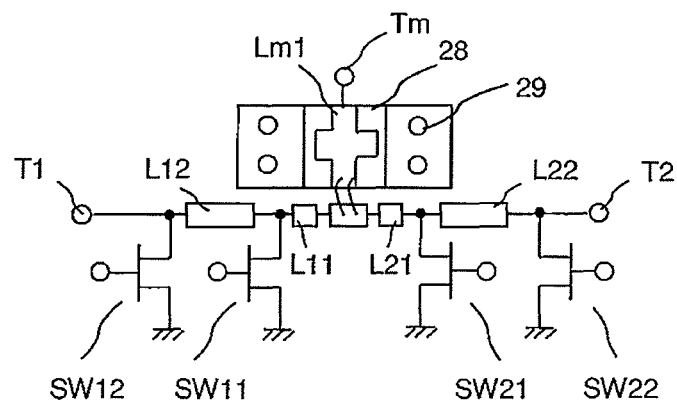
FIG. 23 is a circuit diagram of a second variation of the semiconductor switch of the sixth embodiment.

FIG. 23 is a circuit diagram of a second variation of the semiconductor switch of the sixth embodiment. In this semiconductor switch, the low impedance line Lm1 is a coplanar line with open stubs. The construction of this low impedance line Lm allows it to have a lower impedance, as compared to the construction of the low impedance line shown in FIG. 22, making it easy to reduce the size of the semiconductor switch.

Figure 24:
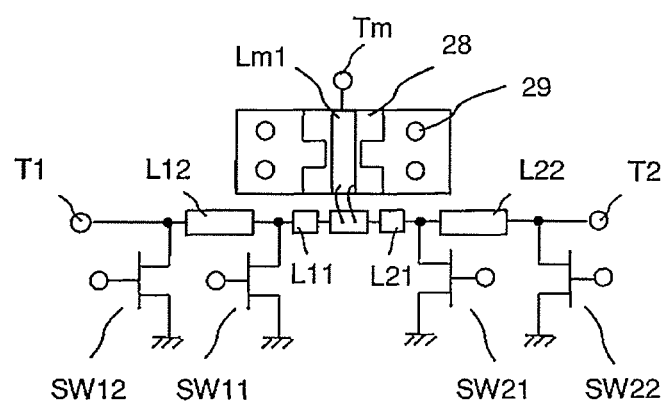
FIG. 24 is a circuit diagram of a third variation of the semiconductor switch of the sixth embodiment.

FIG. 24 is a circuit diagram of a third variation of the semiconductor switch of the sixth embodiment. In this semiconductor switch, the grounding conductors have a slot line configuration and have a portion that is closer to the low impedance line than the other portions. This construction is similar in effect to that shown in FIG. 23, and makes it possible to more easily reduce the impedance of the low impedance line Lm1 and reduce the size of the semiconductor switch.

Seventh Embodiment

Figure 25:
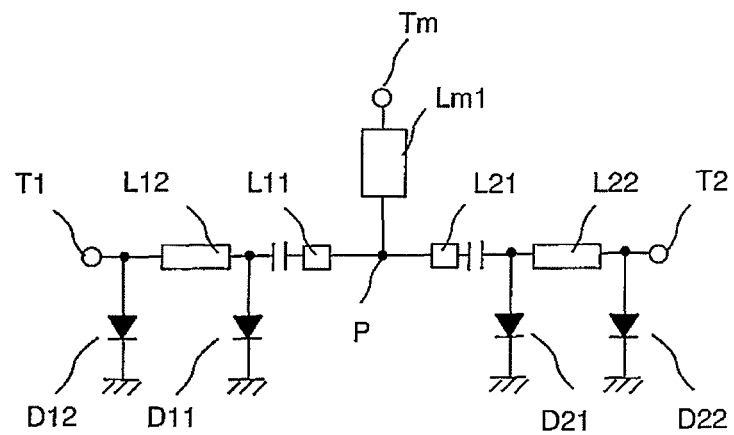
FIG. 25 is a circuit diagram of the semiconductor switch of the seventh embodiment.

A seventh embodiment of the present invention will be described with reference to FIGS. 25 and 26. A semiconductor switch of the seventh embodiment is characterized by including diodes serving as switching devices. FIG. 25 is a circuit diagram of the semiconductor switch of the seventh embodiment. Specifically, this semiconductor switch includes diodes D11, D12, D21, and D22 used as switching devices. A switching device formed by a diode can have a lower on-resistance and off-capacitance than an FET. Therefore, it is possible to reduce the transmission loss and enhance the isolation characteristics of the semiconductor switch. Although in this embodiment the diodes D11, D12, D21, and D22 are GaAs Schottky barrier diodes, in other embodiments they may be GaN or InP Schottky barrier diodes with the same effect.

Figure 26:
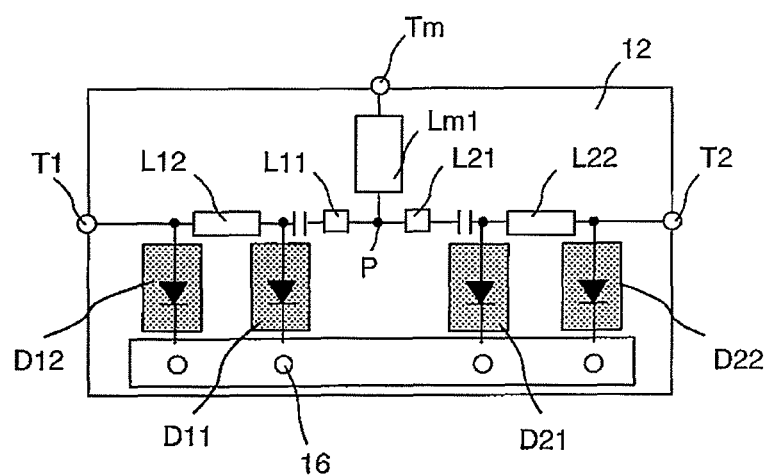
FIG. 26 is a circuit diagram of a variation of the semiconductor switch of the seventh embodiment.

FIG. 26 is a circuit diagram of a variation of the semiconductor switch of the seventh embodiment. This semiconductor switch differs from that shown in FIG. 9 in that the FETs are replaced by diodes D11, D12, D21, and D22. The resulting effect is the same as that described above.

Eighth Embodiment

Figure 27:
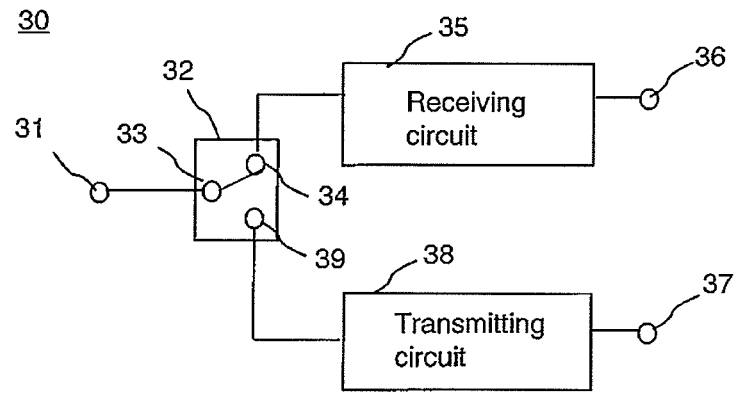
FIG. 27 is a block diagram showing the transceiver of the eighth embodiment.

A transceiver according to an eighth embodiment of the present invention will be described with reference to FIG. 27. The transceiver of the eighth embodiment is characterized by including one of the semiconductor switches of the above embodiments. FIG. 27 is a block diagram showing this transceiver. The transceiver, 30, includes one of the semiconductor switches of the above embodiments. (This semiconductor switch is denoted by the reference numeral 32.) The semiconductor switch 32 includes two branch lines. A transceiver terminal 31 is connected to the main terminal 33 of the semiconductor switch 32. A transmitting/receiving antenna (not shown) is connected to the transceiver terminal 31. The input of a receiving circuit 35 is connected to a branch terminal 34 of the semiconductor switch, and the receiving circuit 35 receives a signal from the branch terminal 34 and outputs it to a signal output terminal 36. The output of a transmitting circuit 38 is connected to a branch terminal 39 of the semiconductor switch, and the transmitting circuit 38 receives a signal from a signal input terminal 37 and amplifies and outputs the signal to the branch terminal 39. The semiconductor switch 32 can be used to switch between transmission and reception. Since the semiconductor switch 32 is compact, this construction enables the size of the transceiver 30 to be reduced without degrading the transmission loss characteristics.

Ninth Embodiment

Figure 28:
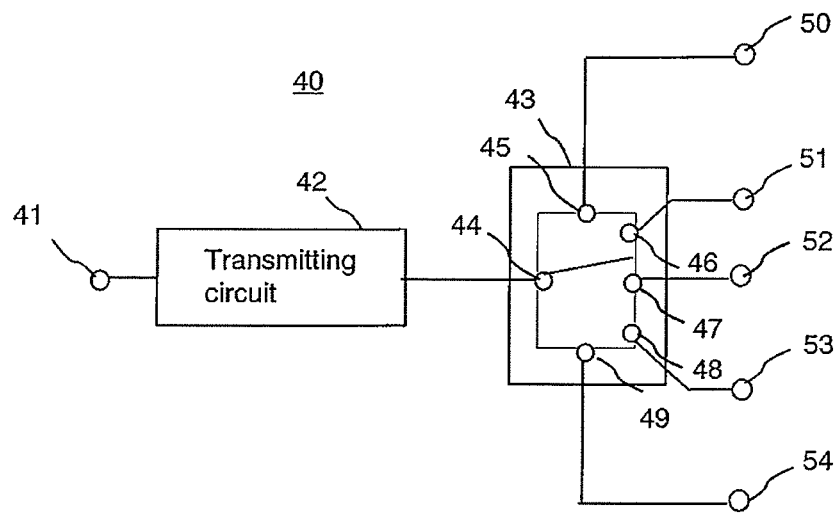
FIG. 28 is a block diagram showing transmitter of the ninth embodiment.

A transmitter according to a ninth embodiment of the present invention will be described with reference to FIG. 28. The transmitter of the ninth embodiment is characterized by including one of the semiconductor switches of the above embodiments. FIG. 28 is a block diagram showing this transmitter. The transmitter, 40, includes one of the semiconductor switches of the above embodiments. (This semiconductor switch is denoted by the reference numeral 43.) The semiconductor switch 43 shown in FIG. 28 includes five branch lines. The output of a transmitting circuit 42 is connected to the main terminal 44 of the semiconductor switch 43, and the transmitting circuit 42 receives a transmission signal from a signal input terminal 41. Transmit terminals 50, 51, 52, 53, and 54 are connected to branch terminals 45, 46, 47, 48, and 49, respectively, of the semiconductor switch. A transmitting antenna (not shown) is connected to each transmit terminal. The semiconductor switch 43 can be used to select any one of these transmitting antennas for transmission. Since the semiconductor switch 43 is compact, this construction enables the size of the transmitter 40 to be reduced without degrading the transmission loss characteristics. The transmitter 40 may be the transmitter unit of a radar device.

Tenth Embodiment

Figure 29:
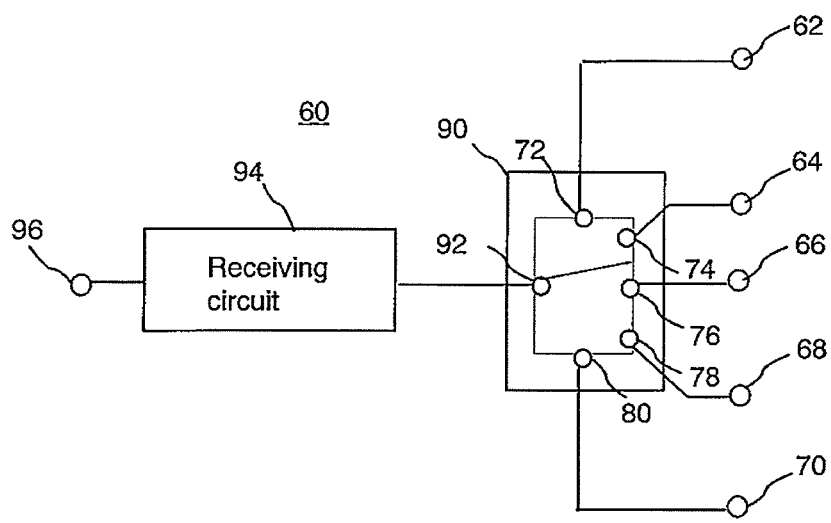
FIG. 29 is a block diagram showing the receiver of the tenth embodiment.

A receiver according to a tenth embodiment of the present invention will be described with reference to FIG. 29. The receiver of the tenth embodiment is characterized by including one of the semiconductor switches of the above embodiments. FIG. 29 is a block diagram showing this receiver. The receiver, 60, includes one of the semiconductor switches of the above embodiments. (This semiconductor switch is denoted by the reference numeral 90.) The semiconductor switch 90 shown in FIG. 29 includes five branch lines. The input of a receiving circuit 94 is connected to the main terminal 92 of the semiconductor switch 90, and the receiving circuit 94 receives a signal from the main terminal 92 and outputs it to a signal output terminal 96. Receive terminals 62, 64, 66, 68, and 70 are connected to branch terminals 72, 74, 76, 78, and 80, respectively, of the semiconductor switch. A receiving antenna (not shown) is connected to each receive terminal. The semiconductor switch 90 can be used to select any one of these receiving antennas for reception. Since the semiconductor switch 90 is compact, this construction enables the size of the receiver 60 to be reduced without degrading the transmission loss characteristics. The receiver 60 may be the receiver unit of a radar device. It should be noted that the transmitting circuit 42 of the ninth embodiment and the receiving circuit 94 of the tenth embodiment are each adapted to turn on and off the switching devices in the semiconductor switch so that one of the branch lines functions to transmit the RF signal and the rest of the branch lines function to block the RF signal. That is, the transmitting circuit 42 and the receiving circuit 94 may be regarded as control circuits connected to the control terminals of the switching devices. Although the present invention has been described with reference to specific embodiments, it is to be understood that various alterations may be made without departing from the scope of the invention.

Thus the present invention allows for the reduction of the dimensions of semiconductor switches, transceivers, transmitters, and receivers.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-065989, filed on Mar. 23, 2010 including specification, claims, drawings and summary, on which the Convention priority of the present application is based, are incorporated herein by reference in its entirety.

What is claimed is:

1. A semiconductor switch comprising:
a main line;
a plurality of branch lines branching from said main line at the same branch point;
switching devices, each switching device being shunt-connected between one of said branch lines and ground, and operated by a control voltage so that said branch line is electrically connected to and disconnected from ground in response to the control voltage;
a main terminal connected to a first end of said main line; and
branch terminals, each branch terminal being connected to a first end of one of said branch lines, wherein
impedance of a first of said branch lines, as seen from said branch point, is conjugately matched to a combination of impedance of said main line and all other of said branch lines, as seen from said branch point,
said first of said branch lines transmits an RF signal,
all other of said branch lines block the RF signal,
each of said branch lines includes a first transmission line and has a first switching device connected to said first transmission line,
a first end of said first transmission line is connected to said branch point,
a second end of said first transmission line is connected to the branch terminal of said branch line,
a first end of said first switching device is connected between said second end of said first transmission line and said branch terminal,
a second end of said first switching device is grounded, and
said main line has a lower characteristic impedance than said first transmission line.

2. The semiconductor switch according to claim 1, wherein said first transmission line has a length not exceeding one-eighth of the wavelength of the RF signal.

3. The semiconductor switch according to claim 1, wherein all of said first transmission lines of said plurality of branch lines have the same characteristic impedance.

4. The semiconductor switch according to claim 1, wherein said switching devices are field effect transistors.

5. The semiconductor switch according to claim 1, wherein said switching devices are diodes.

6. A semiconductor switch comprising:
a main line;
a plurality of branch lines branching from said main line at the same branch point;

switching devices, each switching device being shunt-connected between one of said branch lines and ground, and operated by a control voltage so that said branch line is electrically connected to and disconnected from ground in response to the control voltage;

a main terminal connected to a first end of said main line; and branch terminals, each branch terminal being connected to a first end of one of said branch lines, wherein impedance of a first of said branch lines, as seen from said branch point, is conjugately matched to a combination of impedance of said main line and all other of said branch lines, as seen from said branch point, said first of said branch lines transmits an RF signal, all other of said branch lines block the RF signal, each of said branch lines includes a first transmission line, a second transmission line, a first switching device, and a second switching device, and said first transmission line is connected to said first switching device, and said second transmission line is connected to said second switching device, a first end of said first transmission line is connected to said branch point, a first end of said second transmission line is connected to a second end of said first transmission line, a second end of said second transmission line is connected to the branch terminal of said branch line, a first end of said first switching device is connected between said second end of said first transmission line and said first end of said second transmission line, a second end of said first switching device is grounded, a first end of said second switching device is connected between said second end of said second transmission line and said branch terminal, a second end of said second switching device is grounded, and said main line has a lower characteristic impedance than said first and second transmission lines.

7. The semiconductor switch according to claim 6, wherein:

said first transmission line has a length not exceeding one-eighth of the wavelength of the RF signal; and said second transmission line has a length equal to one-eighth to one-quarter of the wavelength of the RF signal.

8. The semiconductor switch according to claim 6, wherein all of said first and second transmission lines of said plurality of branch lines have the same characteristic impedance.

9. The semiconductor switch according to claim 6, wherein said first transmission line has a length not exceeding one-eighth of the wavelength of the RF signal.

10. The semiconductor switch according to claim 6, wherein said switching devices are field effect transistors.

11. The semiconductor switch according to claim 6, wherein said switching devices are diodes.

12. A semiconductor switch comprising:

a main line;

a plurality of branch lines branching from said main line at the same branch point;

switching devices, each switching device being shunt-connected between one of said branch lines and ground, and operated by a control voltage so that said branch line is electrically connected to and disconnected from ground in response to the control voltage;

a main terminal connected to a first end of said main line; and branch terminals, each branch terminal being connected to a first end of one of said branch lines, wherein impedance of a first of said branch lines, as seen from said branch point, is conjugately matched to a combination of impedance of said main line and all other of said branch lines, as seen from said branch point, said first of said branch lines transmits an RF signal, all other of said branch lines block the RF signal, each of said branch lines includes a first transmission line, a second transmission line, and a third transmission line and has a first switching device, a second switching device, and a third switching device, said first transmission line being connected to said first switching device, said second transmission line being connected to said second switching device and said third transmission line being connected to said third switching device, a first end of said first transmission line is connected to said branch point, a first end of said second transmission line is connected to a second end of said first transmission line, a first end of said third transmission line is connected to a second end of said second transmission line, a second end of said third transmission line is connected to the branch terminal of said branch line, a first end of said first switching device is connected between said second end of said first transmission line and said first end of said second transmission line;

a second end of said first switching device is grounded;

a first end of said second switching device is connected between said second end of said second transmission line and said first end of said third transmission line;

a second end of said second switching device is grounded;

a first end of said third switching device is connected between said second end of said third transmission line and said branch terminal, a second end of said third switching device is grounded, and said main line has a lower characteristic impedance than said first, second, and third transmission lines.

13. The semiconductor switch according to claim 12, wherein all of said first, second, and third transmission lines of said plurality of branch lines have the same characteristic impedance.

14. The semiconductor switch according to claim 12, wherein said first transmission line has a length not exceeding one-eighth of the wavelength of the RF signal.

15. The semiconductor switch according to claim 12, wherein:

said first transmission line has a length not exceeding one-eighth of the wavelength of the RF signal; and said second transmission line has a length equal to one-eighth to one-quarter of the wavelength of the RF signal.

16. The semiconductor switch according to claim 12, wherein said switching devices are field effect transistors.

17. The semiconductor switch according to claim 12, wherein said switching devices are diodes.

* * * * *